United States Patent [19]

Muller

[11] 4,238,735

[45] Dec. 9, 1980

[54] INDIRECT DETECTION OF NUCLEAR SPINS OF LOW GYROMAGENTIC RATIO COUPLED TO SPINS OF HIGH GYROMAGNETIC RATIO

[75] Inventor: Luciano Muller, Mountain View, Calif.

[73] Assignee: Varian Associates, Inc., Palo Alto, Calif.

[21] Appl. No.: 13,999

[22] Filed: Feb. 21, 1979

[51] Int. Cl.³ .......................................... G01N 27/00
[52] U.S. Cl. .................................. 324/310; 324/314
[58] Field of Search ..................... 324/310, 314, 315

[56] References Cited

U.S. PATENT DOCUMENTS

| | | | |
|---|---|---|---|
| 3,792,346 | 2/1974 | Gibby | 324/314 |
| 3,810,001 | 5/1974 | Ernst | 324/314 |
| 4,068,161 | 1/1978 | Ernst | 324/311 |

*Primary Examiner*—Michael J. Tokar

*Attorney, Agent, or Firm*—Stanley Z. Cole; Edward H. Berkowitz

[57] ABSTRACT

In a heteronuclear system, the indirect detection of nuclei S, of weak gyromagnetic ratio, coupled to nuclei I, of strong gyromagnetic ratio, is accomplished by generation of zero and double quantum coherence between the I and S spin systems, during a preparatory period, $t_p$. The zero and double quantum transitions are then interchanged at the midpoint of the evolution period, $t_1$, producing an echo modulated only by S and I-I interactions at the end of the period $t_1$, at which time the zero and double quantum coherence is then converted to I spin single quantum coherence yielding a free induction decay wave form $S(t_2)$ for given $t_1$. The period, $t_1$, is then varied to obtain a two-dimensional function $S(t_1, t_2)$ which is then fully transformed to the frequency domain obtaining $S(\omega_1, \omega_2)$ whereby the chemical shift of the coupled S spin is obtained along the $\omega_1$ axis and the chemical shift of the I spin is obtained along the $\omega_2$ axis.

31 Claims, 8 Drawing Figures

PREPARATION EVOLUTION MIXING DETECTION

INDIRECT DETECTION OF NUCLEAR SPINS OF LOW GYROMAGENTIC RATIO COUPLED TO SPINS OF HIGH GYROMAGNETIC RATIO

FIELD OF THE INVENTION

The present invention relates in general to gyromagnetic resonance spectroscopy and particularly to a method for resolving multiplet structures encountered in such spectroscopy.

BACKGROUND OF THE INVENTION

Two parameter pulse spectroscopy has been employed to resolve multiplet structures in NMR spectra arising from heteronuclear binding. In one method an indirect technique is employed which relies upon the coherent transfer of transverse magentization between coherently coupled spin systems. In this method the transverse magnetization of the first group of resonators is transferred after a time interval $t_1$ to a second group of gyromagnetic resonators coupled to the first group. The duration of the time interval $t_1$ is then changed in successive transient resonances and the free induction decay of the second group is detected by sampling the free induction decay wave form in a plurality of sampling times, $t_2$. The data $S(t_1, t_2)$ from successive free induction decays is then analyzed as a function of successive values for the duration of the intervals $t_1$, to derive gyromagnetic resonance data pertaining to said first group of resonators. It was the purpose of this prior art to achieve enhancement of indirectly observed resonance data by suppressing the directly induced components of the resonance signal. In this method any persistent magnetization due to the second group of resonators is removed and after the period $t_1$ a transverse magnetization is directly induced in the second group of resonators and the data $S'(t_1, t_2)$ is obtained and subtracted from the previously derived function $S(t_1, t_2)$ to suppress the contribution of direct transverse magnetization in the first data function $S(t_1, t_2)$. This method forms the subject matter of commonly assigned co-pending application Ser. No. 912,787, which is in turn a continuation of Ser. No. 843,903 now abandoned.

It is also known in the prior art to observe two-dimensional NMR spectra wherein any desired order of multiple quantum transitions are selectively prepared and detected. U.S. Ser. No. 855,508, commonly assigned with the present invention, teaches a linear combination of phase shifted data $S_i(t_1, t_2, \phi_i)$ obtained by an appropriate sequence of pulses resulting in a set of two-dimensional data arrays which upon proper linear combinations selectively yield the desired multiple quantum transition spectra.

Aue, Bartholdi and Ernst, *J. Chem. Phy.*, Vol. 64, No. 5, pp. 2229–2246 discuss zero and double quantum transitions in NMR experiments. Preparation of nonequilibrium initial states is there realizable by any of three exemplary pulse sequences. After a subsequent evolution period, $t_1$, a mixing pulse is applied to transform multiple quantum transitions to single quantum transitions. The work of Aue, et al. is limited to excitation and observation of multiple quantum transitions in homonuclear systems.

SUMMARY OF THE INVENTION

The method of the present invention is directed to a heteronuclear spin system (I and S denoting such coupled spin systems) for detection of S-spin properties directly, and by indirect techniques through measurements carried out on I-spin nuclei where the I-spin nuclei are characterized by a much larger gyromagnetic ratio compared to the S-spin nuclei. In the present invention zero and double quantum coherence between the coupled I and S spin systems evolves and is subsequently converted to single quantum coherence in the I-spin system (using the indirect embodiment) for observation as a free induction decay signal $S(t_2)$ for a number of values of evolution time $t_1$. Thus, two parameter time domain data $S(t_1, t_2)$ are obtained.

It is an object of the present invention to achieve improved sensitivity for detection of gyromagnetic resonance in a heteronuclear system wherein the gyromagnetic ratio of the investigated spin is very weak in comparison with that of the detected spin.

In one feature of the invention a non-equilibrium state is prepared wherein heteronuclear zero and double quantum coherence is achieved between coupled S-I spins by application of first and second 90° pulses to the I-spins, said pulses separated by a particular preparatory time interval, $t_p$.

In another feature of the invention a 90° pulse is also applied to the S-spins concurrently with the second 90° pulse applied to the I-spins whereby the respective S and I spins are brought to a condition of coplanarity to establish conditions for coupling.

In yet another feature of the invention, respective 180° pulses are applied to each of the S and I spins at the time $t=(t_p)/2$ whereby perturbing single quantum coherence is substantially suppressed in both said spin systems and all static field inhomogeneities are refocused.

In still another feature of the invention the magnetization of the coupled system is permitted to evolve for a period $t_1$ wherein a non-selective echo pulse is applied to the I-spin at $t=(t_1)/2$ whereby the amplitudes of heteronuclear zero and double quantum coherence are substantially mutually interchanged to produce an echo at the conclusion of the period $t_1$, which echo is modulated with the frequencies of the S-spin and I-I spin interactions.

In again another feature of the invention the heteronuclear zero and double quantum coherence is converted to I-spin single quantum coherence for observation as a free induction decay.

In yet still another feature of the invention the duration of the interval $t_1$ is changed in successive transient excitations and the free induction decay of the I-spin resonance is detected by sampling at a plurality of sampling times distributed over the interval $t_2$.

In again another feature of the invention the data $S(t_1, t_2)$ from successive free induction decays is analyzed as a function of successive values of the duration of the interval $t_1$ to derive heteronuclear spin correlation data from which the chemical shift of the S-spins and I-spins can be identified.

Other features and advantages of the present invention will become apparent upon perusal of the following specification taken in connection with the accompanying drawings wherein:

BRIEF DESCRIPTION OF THE DRAWINGS

FIG. 4 is a phase sensitive cross correlation of the multiple quantum spectrum of methyliodide obtained with pulse sequence of FIG. 2a.

DETAILED DESCRIPTION OF THE INVENTION

Figure 1:
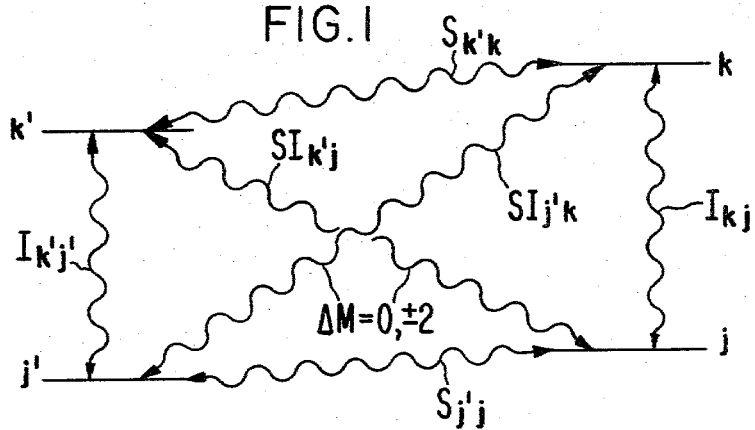
FIG. 1 is a schematic level diagram for a heteronuclear two spin system.

Turning now to FIG. 1, the physical system characteristic pertinent to this invention are elucidated for a two spin-$\frac{1}{2}$ coupled system. Two distinct groups of resonators S and I are present in the sample. For simplicity each of S and I are assumed to exhibit respective gyromagnetic ratios and nuclear spins of $\frac{1}{2}\hbar$. S and I atoms are further assumed to couple via spin-spin interaction forming a heteronuclear system. Thus each spin-$\frac{1}{2}$ system forms a doublet and the transition symbolically given (in obvious notation) as $I_{k'j}, I_{kj}, S_{k'k}, S_{j'j}$ are transitions altering the population of respective sublevels of the corresponding systems. The transitions S-$I_{j'k}$ and S-$I_{jk}$, are heteronuclear transitions further characterized as subject to the selection rule $\Delta M = 0, \pm 2$. It will be observed that for a pair of spin $\frac{1}{2}$ nuclei, the transition $\Delta M = \pm 2$ can be visualized as a parallel coupling of spins (total spin angular momentum = 1) in both initial and final state, the coupled system undergoing a 180° flip. Such a transition requires two radiative quanta to so alter the projection of total vector angular momentum of the system (e.g., from $\pm 1$ to $\mp 1$) and this is called a double quantum transition.

A physical model of a zero quantum transition in the above-described system can be visualized for two spin $\frac{1}{2}$ nuclei as an anti-parallel spin coupled system in both initial and final states wherein each of S and I nuclei undergo 180° flips leaving unaltered the null angular momentum projection. It will be noted, however, that such a process, although termed a zero quantum transition is actually a species of two quantum transitions because both emission and absorption quanta are required.

Figure 2A:
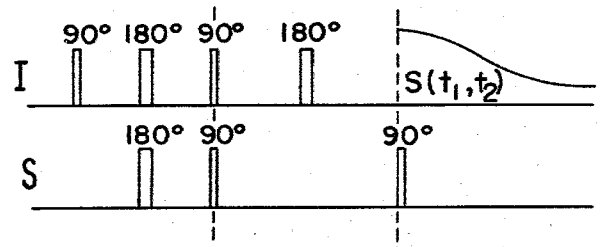
FIG. 2a is a pulse sequence for indirect measurement of S spin data.
Figure 2B:
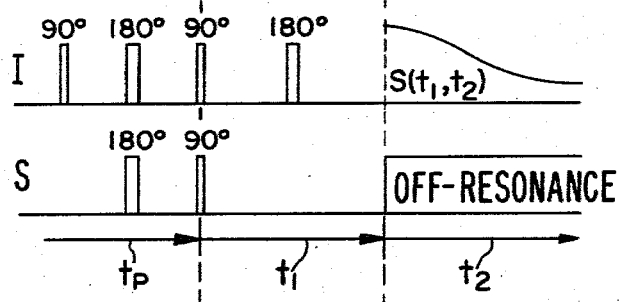
FIG. 2b is a pulse sequence for indirect measurement of S spin data using off resonance decoupling.
Figure 2C:
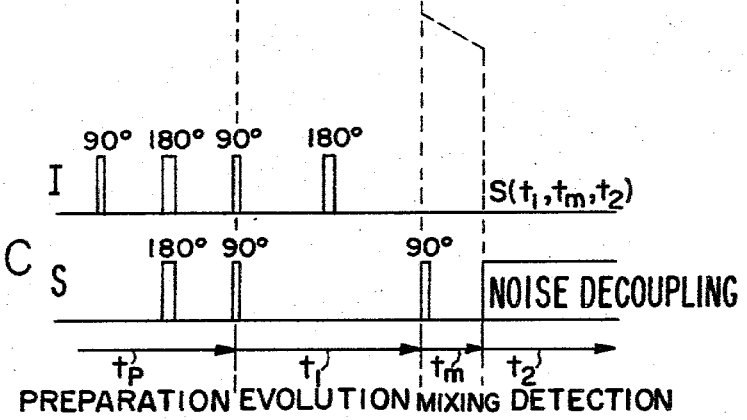
FIG. 2c is a pulse sequence for using noise decoupling and a coupled mixing period while indirectly observing S-spin spectra.
Figure 5:
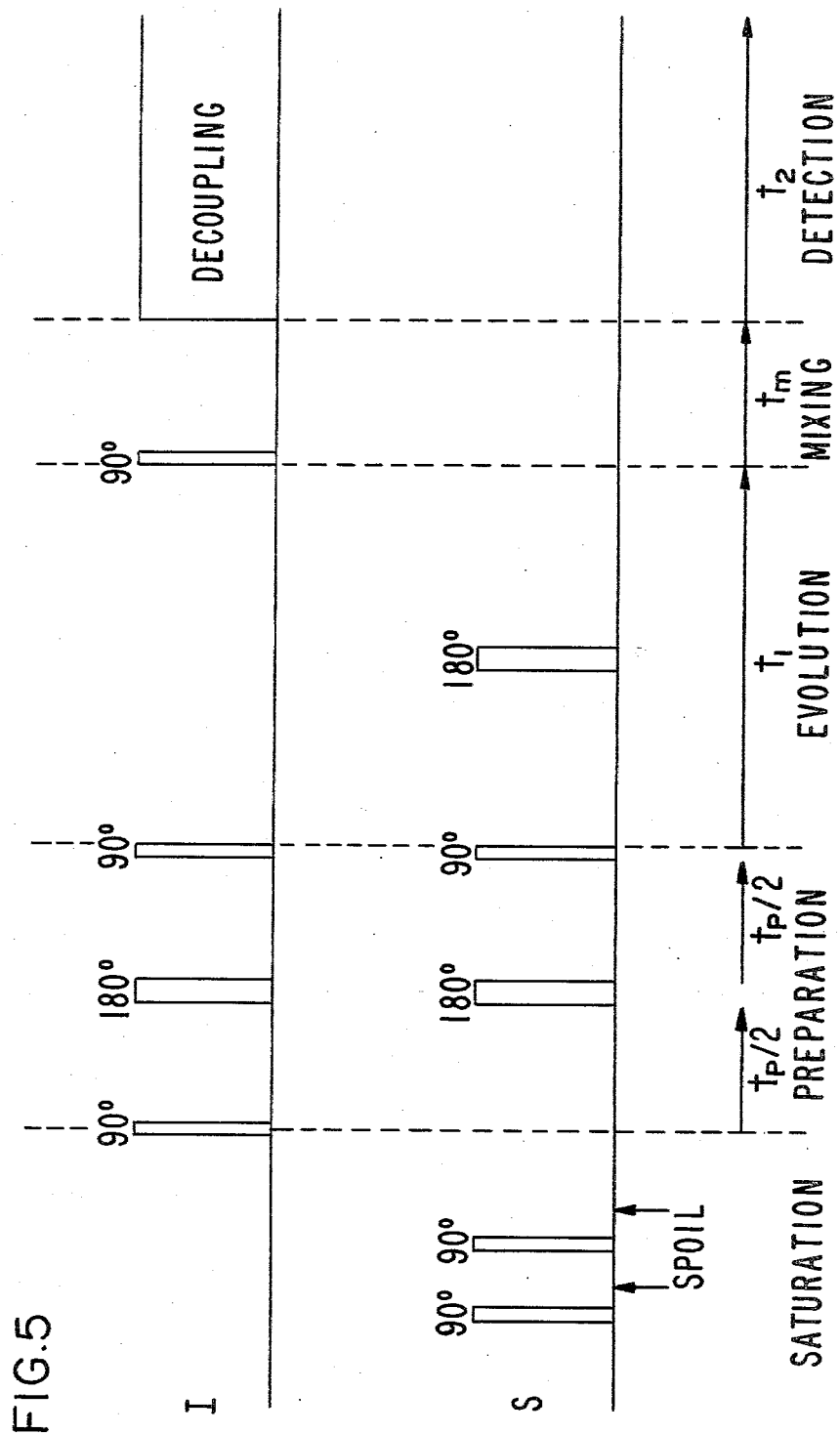
FIG. 5 is a pulse sequence for direct observation of the spin system, S, of weak gyromagnetic moment.

Turning to FIG. 2 there are shown three pulse sequences and detection schemes characterizing a preferred embodiment of the invention. All three schemes, represented by FIGS. 2a, 2b and 2c comprise a preparatory interval, $t_p$, an evolution interval, $t_1$, and a further period, $t_2$. A mixing period $t_m$ is also employed in certain instances. (A pre-conditioning period is also useful to preclude anomalies arising from a steady state of non-zero net magnetization as indicated in FIG. 5). The preparatory period is common to the three figures and it is designed to produce a non-equilibrium statistical state of the coupled resonators of the sample quantum system. In the present invention, these coupled resonators represent a heteronuclear molecule such as a $^{13}$C labeled hydrocarbon, wherein for example, $^{13}$C and protons interact via spin-spin interaction in the subject molecule. The particular choice of preparatory pulse scheme is further elucidated below; the purpose of the preparatory period in the present invention is to produce significant amplitudes for transitions among the coupled pairs wherein the interacting spins ($^{13}$C and protons are used as examples) execute transitions characterized by the selection rules $\Delta M = 0, \pm 2$. These induced transitions characterize zero and double quantum coherence and such transitions are termed "forbidden" for the reason that the corresponding calculated transition matrix elements vanish in first order time dependent pertubation theory. The occurrence of such transitions are not forbidden in any absolute sense but the intensity of transitions for which $\Delta M = 0, \pm 2$ is greatly reduced compared to the allowed transitions, $\Delta m = \pm 1$.

In a density matrix formulation for such a system of spin-spin coupled molecules, the zero and double quantum coherence transitions are described by certain off-diagonal elements. These transitions are thus not observable by direct measurement for the physical reason that these transitions do not produce a transverse magnetization component. Upon application of a mixing pulse, it is possible to transform the magnetization components representative of these transitions to transverse components which are observable.

As indicated in FIGS. 2a, b and c, at the conclusion of the evolution period a 90° pulse applied to the S spins serves to effect the required transformation to transverse magnetization components and a free induction decay of the I-spins is observed. The evolution interval, $t_1$, is varied and the resulting function $S(t_1, t_2)$ is collected, time averaged and double Fourier transformed to the frequency domain and then displayed as a two-dimensional spectrum.

In the preferred embodiment of the present invention it is been found that at the center of the evolution period the application of a non-selective 180° echo pulse applied to the I-spins has the effect of exchanging amplitudes of heteronuclear zero and two quantum coherence. As a result, at the conclusion of the evolution period, the echo is modulated only by frequencies characteristic of the S spins and the I-I interactions, provided that all spins are weakly coupled. This pulse provides a refocussing of the chemical shift of the I-spins to which it is applied and of all the heteronuclear spin-spin interactions.

In the pulse sequence of FIGS. 2a, b, and c pulses applied during the preparation period have the same phase for each of the S and I pulses although no fixed phase relationship is required between the respective S and I carrier frequencies.

Figure 3:
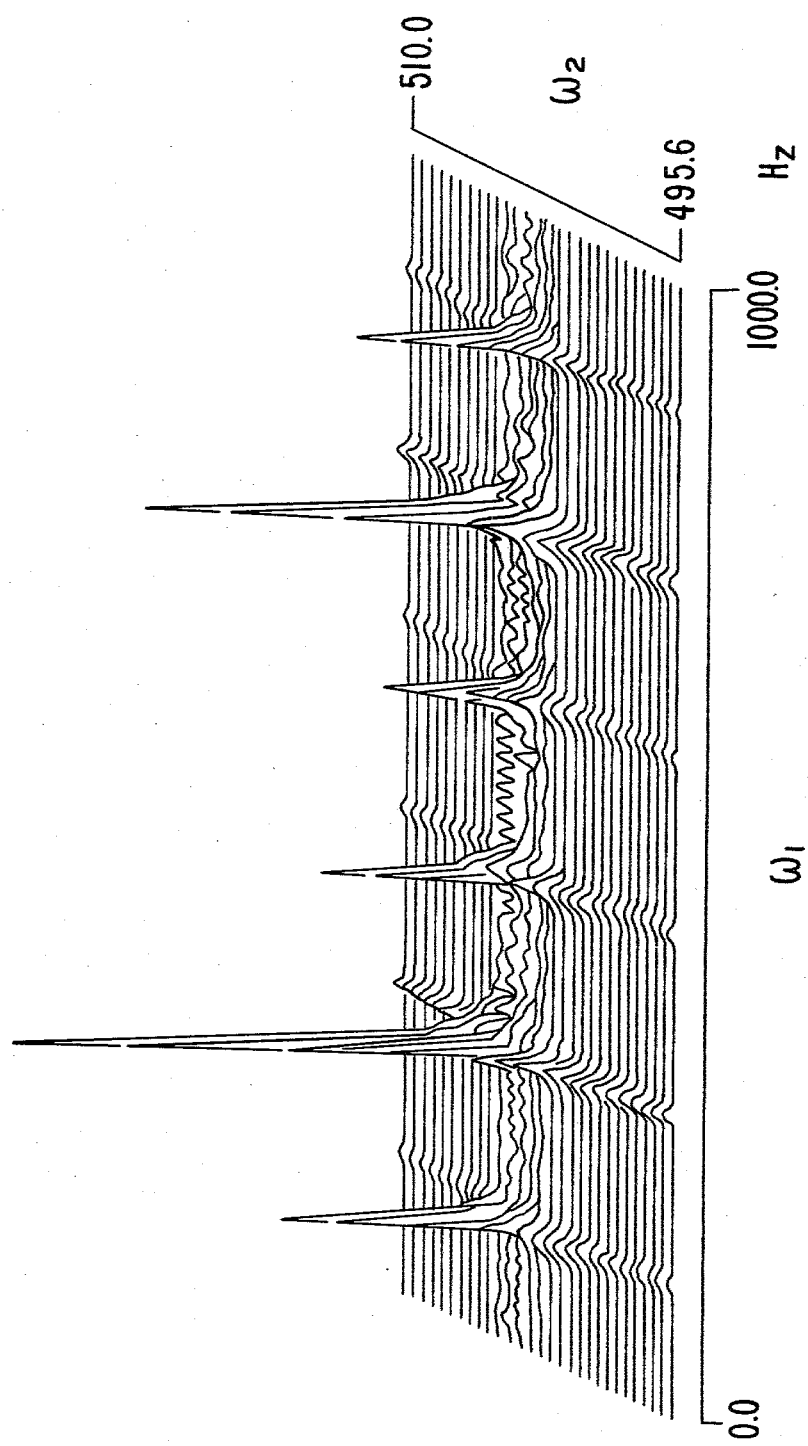
FIG. 3 is a heteronuclear multiple quantum spectrum of methyliodide.
Figure 4:
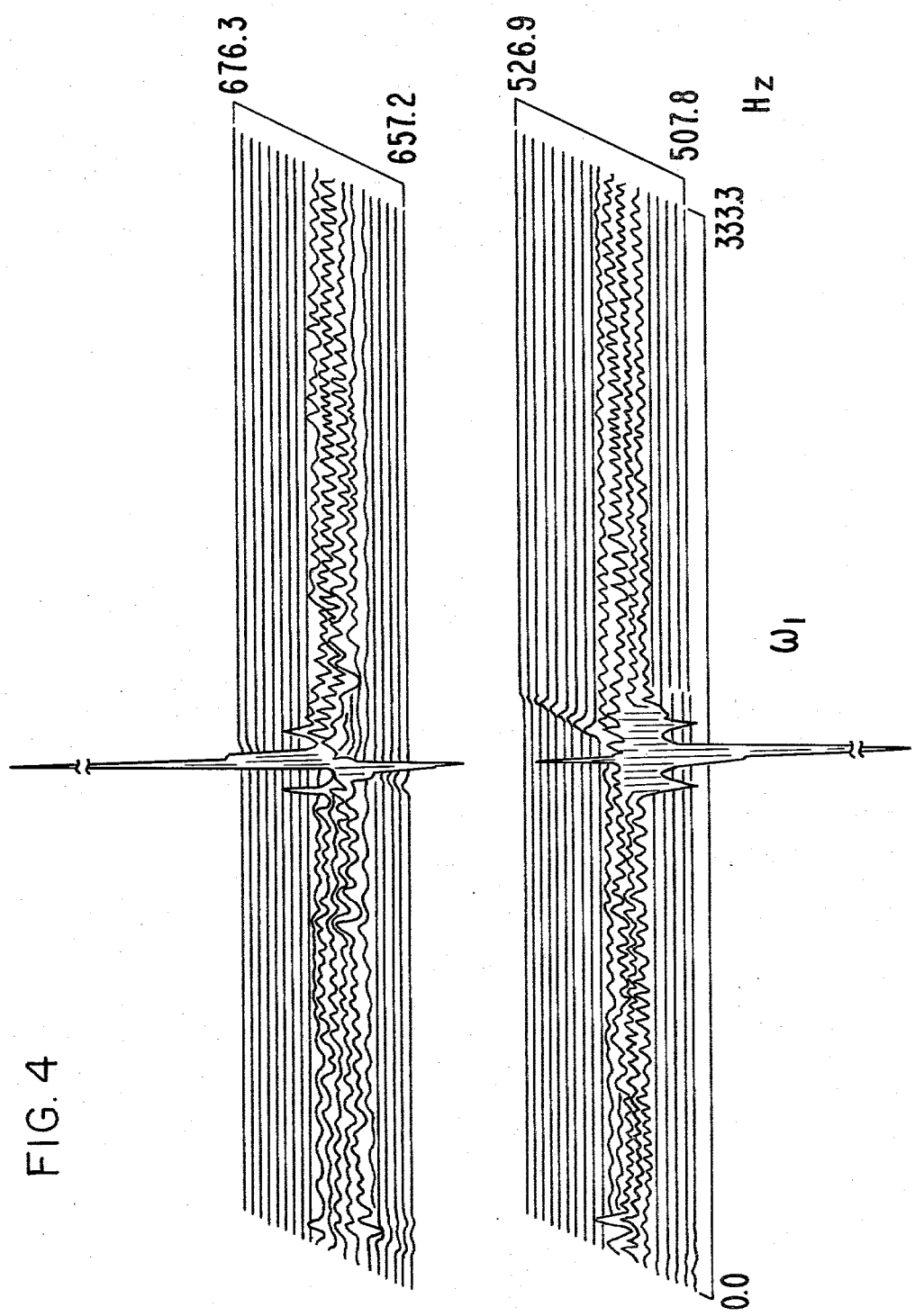

Another embodiment of the invention may be discerned from FIGS. 2a, b and c, with the omission of the 180° echo pulse at the midpoint of $t_1$. This basic spectroscopic method is broadly described as generation and detection of multiple quantum coherence in heteronuclear systems. By including the 180° pulse simplification is introduced into the two-dimensional spectra resulting from excitation of heteronuclear multiple quantum coherence transitions and the indirect detection of such resonance because such spectra will not contain signals originating from uncoupled spins or other heteronuclear systems. Thus, for example, investigations of $^{13}$C labeled hydrocarbons are guaranteed to be free of intense proton signals originating from uncoupled protons or protons coupled to $^{12}$C. This may be ascertained from FIG. 3 which illustrates multiple quantum coherence of indirectly detected heteronuclear systems after conversion to single quantum coherence. The sample examined is $^{13}$CH$_3$I and the spectra obtained measure the proton decoupled $^{13}$C resonance frequency along the $\omega_2$ axis. On the $\omega_1$ axis the triplet to the left (lower values of $\omega_1$) arises from the four $\Delta M=0$ transitions and the triplet to the right (higher values of $\omega_1$) is due to four $\Delta M = \pm 2$ transitions. Both of these sets of transitions contain degeneracies resulting in triplets (instead of quadruplets) with the observed intensity ratios.

It is anticipated that one spin species of a heteronuclear coupled system is characterized by a weak gyromagnetic ratio. Alternatively or conjunctively, one of spin species may be present in dilute concentrations, as is the case for certain naturally occuring isotopes (e.g., $^{13}C$). The indirect methods of FIGS. 2a, b and c (and the same methods without the 180° pulse at $t_1/2$) represent a greatly enhanced sensitivity for observing nuclei of low concentration and/or weak gyromagnetic ratio because the Zeeman polarization of the strong gyromagnetic spin species serves to generate the initial state and it is the signal originating from the same easily observed spin species which is actually detected to yield information concerning the weak gyromagnetic spin species.

The two spin systems and the transitions of the heteronuclear system are quite symmetrically related. These transitions can be generated from either spin system and the conversion to single quantum coherence can be effected in either spin species. Thus, there is a concomitant set of experiments parallel to FIGS. 2a, b and c wherein the weak gyromagnetic spin species is directly detected. Therefore, another embodiment of this invention is suggested which utilizes direct observation of S spin spectra with I spin-decoupling. This is preferably accomplished with the pulse sequence of FIG. 5 which is observed to differ from the sequence described in FIG. 2c in that the 180° echo pulse at $t_1/2$ applied to I spins and the 90° conversion pulse applied to S spins are here interchanged. This interchange may be effected with each of the pulse sequences of FIG. 2 but the pulse sequence of FIG. 5 is preferred for maximum sensitivity. Decoupling is here applied during the detection period to the spins not actually observed. As a result the multiplet of observed spins is collapsed and the resulting spectral peak intensity is enhanced. A conventional pre-preparation saturation sequence is also employed to remove lingering magnetization in a series of excitations.

Figure 6:
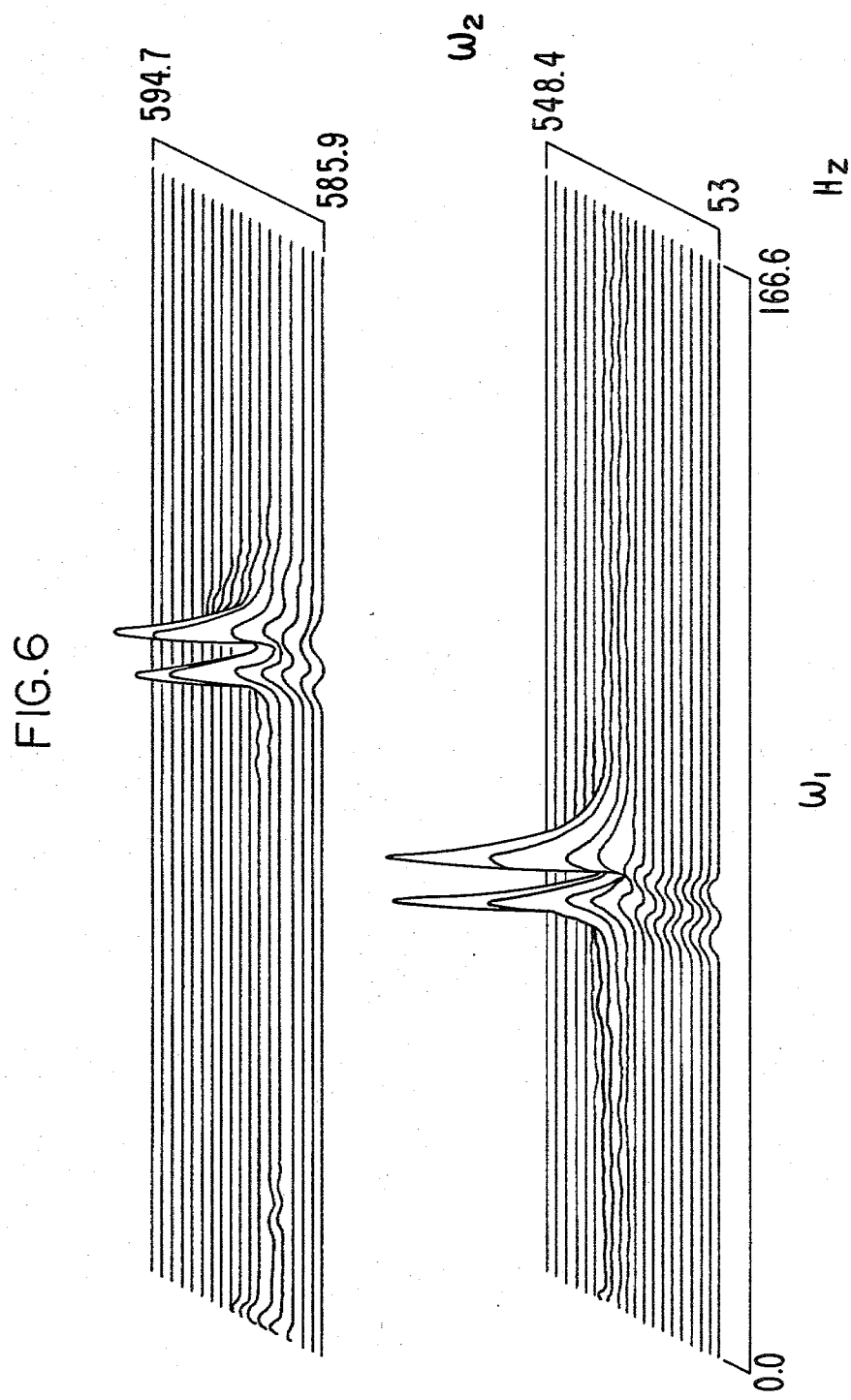
FIG. 6 is an absolute value spectrum obtained by the pulse sequence of FIG. 5.

FIG. 6 illustrates spectra obtained by the direct method of FIG. 5. The sample is 2, 3 dibromothiophene in $D_6$-acetone. Projection onto $\omega_2$ yields the proton decoupled $^{13}C$ doublet. The projection onto $\omega_1$ is the proton spectrum. The line width of the spectrum projected onto $\omega_1$ is characteristic of the multiquantum transition. The method of FIG. 5 employs a mixing period and as a result one obtains an absolute value spectrum unless further phase correction processing is employed.

The establishment of multiple quantum coherence conditions in the preparatory period is enhanced in the present invention by the additional application of 180° pulses to both I and S spin systems at the midpoint of the preparatory interval $t_p$. The 180° pulse directed to the I spins refocusses these moments at $t_p$ at which time the second (90°) pulse rotates this spin to remove any net transverse magnetization. The 180° pulse directed to the S spins operates on precessing doublet components yielding no net magnetization. During the first half of the period $t_p$, these precessing components are diverging. The effect of the 180° pulse is to interchange the precessing components thereby permitting the relative divergence to continue. If the magnitude of the interval $t_p$ has been chosen correctly, the divergence will be maximum at the conclusion of $t_p$ and the anti-parallel S doublet moments will then be flipped in concert with the I spins. Thus transverse magnetization arising from uncoupled I spins has been suppressed by the 180° I spin pulse and the S spins moments are rotated to exhibit maximum heteronuclear coupling to the I spins. The choice of the magnitude of $t_p$ is known to depend upon the heternuclear coupling constant $J_{IS}$ and can be shown to be $$t_p \approx 1/2 J_{IS}$$

The length of the mixing period for realizing the signal using the direct method of FIG. 5 is based upon the same considerations discussed above. An optimal choice for $t_m$ is $\frac{1}{2}$ ($t_p$).

It will be apparent that many changes could be made in the above described methods and many apparently different embodiments of this invention could be made without departing from the scope thereof; for example, the 180° pulse at the midpoint of the evolution period can be replaced by a train of 180° pulses distributed over the evolution period to further reduce the complexity of spectra where strong coupling in the I-I interaction is accidentally enhanced by the I-S coupling. It is therefore intended that all matter contained in the above description and shown in accompanying drawings shall be interpreted as illustrative and not in a limiting sense.

What is claimed is:

1. In a method of gyromagnetic resonance spectroscopy for indirectly detecting transient gyromagnetic resonances of a first group of gyromagnetic resonators interacting with a second group of gyromagnetic resonators forming heteronuclear spin coupled resonating systems within a sample of matter to be analyzed, said heteronuclear systems exhibiting multiple quantum coherence, the steps of (a) preparing a non-equilibrium resonant statistical state of an assembly of said heteronuclear resonators, said state characterized by nonvanishing zero and double quantum coherence transitions;

(b) permitting said non-equilibrium state to evolve for a first interval of time;

(c) applying a nonselective 180° pulse of RF energy to said second group whereby heteronuclear zero and double quantum transition amplitures are interchanged;

(d) permitting continued evolution of said non-equilibrium state for a further first interval of time;

(e) applying a 90° pulse of RF energy to said first group of resonators whereby zero and double quantum coherence in said heteronuclear spin coupled system is converted to single quantum coherence in said second group of gyromagnetic resonance;

(f) detecting and recording the free induction decay of said resonators over a second interval of time after application of said conversion pulse;

(g) changing said first period of time by an increment thereof and repeating steps a–e inclusive, whereby a two dimensional function of said first and second time interval is developed;

(h) double Fourier transforming said function to the frequency domain.

2. The method of claim 1 wherein said step of detecting comprises applying coherent radiation to said first group of resonators during said second interval of time to decouple said first group of resonators from said second group.

3. The method of claim 1 wherein said step of detecting comprises permitting said coupled systems to continue to interact following said conversion pulse for a mixing period of time preceding said second interval of time, and applying broad band RF irradiation to said first group of resonators during said second interval of time to decouple said first group of resonators from said second group.

4. The method of claim 2 or 3 wherein said step of preparing said non-equilibrium statistical state comprises applying a first preparatory 90° RF pulse to said second group of resonators and after a preparatory interval, $t_p$, applying a second preparatory 90° RF pulse to said second group of resonators;

applying a 180° pulse to each said groups of resonators at substantially the time $\frac{1}{2}t_p$ with respect to said first preparatory pulse; and applying a 90° RF pulse to said first group of resonators substantially concurrent with said second preparatory pulse.

5. The method of claim 4 wherein said preparatory interval is approximately the reciprocal of twice the coupling constant characterizing the interaction of said first and second groups of resonators.

6. The method of claim 5 including the step of destroying any persistent magnetization of said second group of gyromagnetic resonators prior to said step of preparing said non-equilibrium statistical state.

7. The method of claim 6 further comprising the step of forming a two-dimensional spectral display of said Fourier transformed frequency domain spectral data for resolving and identifying multiplet spectral structures associated with said first group of resonators.

8. In a method of gyromagnetic resonance spectroscopy for directly detecting transient gyromagnetic resonances of a first group of gyromagnetic resonators interacting with a second group of gyromagnetic resonators forming heteronuclear spin coupled resonating systems within a sample of matter to be analyzed, said heteronuclear systems exhibiting multiple quantum coherences, the steps of (a) preparing a non-equilibrium resonant statistical state of an assembly of said heteronuclear resonators, said state characterized by nonvanishing zero and double quantum coherence transitions;

(b) permitting said non-equilibrium state to evolve for a first interval of time $t_1$;

(c) applying a 90° pulse of RF energy to said first group of resonators at the conclusion of a preparatory period $t_p$ whereafter zero and double quantum coherence in said heteronuclear spin coupled system is converted to single quantum coherence in said second group of gyromagnetic resonators;

(d) detecting and recording the free induction decay of said resonances of said second group of resonators over a second interval of time, $t_2$, after application of said conversion pulse;

(e) changing said first interval of time by an increment thereof and repeating the steps a–e inclusive, whereby a function $S(t_1, t_2)$ is developed;

(f) double Fourier transforming said function $S(t_1, t_2)$ to the frequency domain.

9. The method of claim 8 further comprising applying a non-selective 180° pulse of RF energy to said second group, after lapse of one half said first interval of time, whereby heteronuclear zero and double quantum transition amplitudes are interchanged, permitting continued evolution of said non-equilibrium state for a further interval of time equal to one half said first interval of time.

10. The method of claim 8 wherein said step of detecting comprises applying coherent radiation to said first group of resonators during said second interval of time to decouple said first group of resonators from said second group.

11. The method of claim 8 wherein said step of detecting comprises permitting said coupled systems to continue to interact following said conversion pulse for a mixing period of time preceding said second interval of time, and applying RF noise radiation to said first group of resonators during said second interval of time to decouple said first group of resonators from said second group.

12. The method of claim 10 or 11 wherein said step of preparing said non-equilibrium statistical state comprises applying a first preparatory 90° RF pulse to said second group of resonators and after a preparatory interval $t_p$ applying a second preparatory pulse to said second group of resonators;

applying a 180° pulse to each said groups of resonators at substantially the time $t_p/2$ with respect to said first preparatory pulse; and applying a 90° RF pulse to said first group of resonators substantially concurrent with said second preparatory pulse.

13. The method of claim 12 wherein said preparatory interval is approximately the reciprocal of twice the coupling constant determining the interaction of said first and second groups of resonators.

14. The method of claim 13 including the step of destroying any persistent magnetization of said second group of gyromagnetic resonators prior to said step of preparing said non-equilibrium statistical state.

15. The method of claim 14 further comprising the step of forming a two-dimensional spectral display of said Fourier transformed frequency domain spectral data for resolving and identifying multiplet spectral structures associated with said first group of resonators.

16. In a method of heteronuclear gyromagnetic resonance spectroscopy wherein spin-spin coupled gyromagnetic resonators are initially prepared to exhibit multiple quantum coherence by application of first and second 90° pulses spaced by an interval of time, said pulses applied to a first group of appropriate resonators and a third 90° pulse applied to a second group of resonators substantially concurrent with said second 90° pulse, the improvement comprising applying a 180° pulse concurrently to each said groups of resonators at substantially the midpoint of said interval of time.

17. In a method of gyromagnetic resonance spectroscopy for indirectly detecting transient gyromagnetic resonances of a first group of gyromagnetic resonators interacting with a second group of gyromagnetic resonators forming heteronuclear spin coupled resonating systems within a sample of matter to be analyzed, said heteronuclear systems exhibiting multiple quantum coherence, the steps of
- (a) preparing a non-equilibrium resonant statistical state of an assembly of said heteronuclear resonators, said state characterized by nonvanishing zero and double quantum coherence transitions;
- (b) permitting said non-equilibrium state to evolve for a first interval of time, $(\frac{1}{2})t_1$;
- (c) applying a nonselective 180° pulse of RF energy to said first group whereby heteronuclear zero and double quantum transition amplitudes are interchanged;
- (d) permitting continued evolution of said non-equilibrium state for a further first interval of time;
- (e) applying a 90° pulse of RF energy to said second group of resonators whereby zero and double quantum coherence in said heteronuclear spin coupled system is converted to single quantum coherence in said second group of gyromagnetic resonators;
- (f) detecting and recording the free induction decay of said resonances over a second interval of time after application of said conversion pulse;
- (g) changing said first period of time by an increment thereof and repeating the steps a–e inclusive, whereby a two-dimensional function of said first and second time interval is developed;
- (h) double Fourier transforming said function to the frequency domain.

18. The method of claim 17 wherein said step of detecting comprises
applying coherent radiation to said first group of resonators during said second interval of time to decouple said first group of resonators from said second group.

19. The method of claim 17 wherein said step of detecting comprises
permitting said coupled systems to continue to interact following said conversion pulse for a mixing period of time preceding said second interval of time, and
applying RF noise radiation to said first group of resonators during said second interval of time to decouple said first group of resonators from said second group.

20. The method of claim 18 or 19 wherein said step of preparing said non-equilibrium statistical state comprises
applying a first preparatory 90° RF pulse to said second group of resonators and after a preparatory interval, $t_p$, applying a second preparatory 90° pulse to said second group of resonators;
applying a 180° pulse to each said groups of resonators at substantially the time $\frac{1}{2}t_p$ with respect to said first preparatory pulse; and
applying a 90° RF pulse to said first group of resonators substantially concurrent with said second preparatory pulse.

21. The method of claim 20 wherein said preparatory interval is approximately the reciprocal of twice the coupling constant characterizing the interaction of said first and second groups of resonators.

22. The method of claim 21 including the step of destroying any persistent magnetization of said second group of gyromagnetic resonators prior to said step of preparing said non-equilibrium statistical state.

23. The method of claim 27 further comprising the step of forming a two-dimensional spectral display of said Fourier transformed frequency domain spectral data for resolving and identifying multiplet spectral structures associated with said first group of resonators.

24. In a method of gyromagnetic resonance spectroscopy
for directly detecting transient gyromagnetic resonances of a first group of gyromagnetic resonators interacting with a second group of gyromagnetic resonators forming heteronuclear spin coupled resonating systems within a sample of matter to be analyzed, said heteronuclear systems exhibiting multiple quantum coherences, the steps of
- (a) preparing a non-equilibrium resonant statistical state of an assembly of said heteronuclear resonators, said state characterized by nonvanishing zero and double quantum coherence transitions;
- (b) permitting said non-equilibrium state to evolve for a first interval of time $t_1$;
- (c) applying a 90° pulse of RF energy to said second group of resonators at the conclusion of preparatory period $t_p$ where zero and double quantum coherence in said heteronuclear spin coupled system is converted to single quantum coherence in said second group of gyromagnetic resonators;
- (d) detecting and recording the free induction decay of said resonances of said first group of resonators over a second interval of time, $t_2$, after application of said conversion pulse;
- (e) changing said first interval of time by an increment thereof and repeating steps a–e inclusive, whereby a function $S(t_1, t_2)$ is developed;
- (f) double Fourier transforming said function $S(t_1, t_2)$ to the frequency domain.

25. The method of claim 24 further comprising
applying a non-selective 180° pulse of RF energy to said second group, after lapse of one half said first interval of time, whereby heteronuclear zero and double quantum transition amplitudes are interchanged, 'permitting continued evolution of said non-equilibrium state for a further interval of time equal to one half said first interval of time.

26. The method of claim 24 wherein said step of detecting comprises
applying coherent radiation to said second group of resonators during said second interval of time to decouple said second group of resonators from said first group.

27. The method of claim 24 wherein said step of detecting comprises
permitting said coupled systems to continue to interact following said conversion pulse for a mixing period of time preceding said second interval of time, and
applying RF noise radiation to said second group of resonators during said second interval of time to decouple said second group of resonators from said first group.

28. The method of claim 26 or 27 wherein said step of preparing said non-equilibrium statistical state comprises
applying a first preparatory 90° RF pulse to said first group of resonators and after said preparatory interval $t_p$ applying a second preparatory pulse to said first group of resonators;

applying a 180° pulse to each said group of resonators at substantially the time $t_p/2$ with respect to said first preparatory pulse; and applying a 90° RF pulse to said second group of resonators substantially concurrent with said second preparatory pulse.

29. The method of claim 28 wherein said preparatory interval is approximately the reciprocal of twice the coupling constant determining the interaction of said first and second groups of resonators.

30. The method of claim 29 including the step of destroying any persistent magnetization of said first group of gyromagnetic resonators prior to said step preparing said non-equilibrium statistical state.

31. The method of claim 30 further comprising the step of forming a two-dimensional spectral display of said Fourier transformed frequency domain spectral data for resolving and identifying multiplet spectral structures associated with said second group of resonators.

* * * * *